(12) United States Patent
Passemard et al.

(10) Patent No.: US 8,114,777 B2
(45) Date of Patent: Feb. 14, 2012

(54) HORIZONTAL NANOTUBE/NANOFIBER GROWTH METHOD

(75) Inventors: Gérard Passemard, Bilieu (FR);
Sylvain Maitrejean, Grenoble (FR);
Valentina Ivanova-Hristova, Grenoble (FR)

(73) Assignees: STMicroelectronics, Grenoble (FR);
Commissariat a l'energie Atomique, Paris (FR)

( * ) Notice: Subject to any disclaimer, the term of this patent is extended or adjusted under 35 U.S.C. 154(b) by 523 days.

(21) Appl. No.: 12/317,143

(22) Filed: Dec. 19, 2008

(65) Prior Publication Data

US 2009/0212006 A1    Aug. 27, 2009

(30) Foreign Application Priority Data

Dec. 20, 2007   (FR) ...................................... 07 60119

(51) Int. Cl.
*H01L 21/302* (2006.01)
(52) U.S. Cl. ............................ 438/694; 438/692; 216/40
(58) Field of Classification Search ................... 438/692, 438/693, 700, 702, 712, 637, 641, 694; 216/39, 216/40, 89
See application file for complete search history.

(56) References Cited

U.S. PATENT DOCUMENTS

| | | | |
|---|---|---|---|
| 7,951,422 B2 * | 5/2011 | Pan et al. ................... | 427/248.1 |
| 2004/0164327 A1 | 8/2004 | Shin et al. | |
| 2005/0215049 A1 | 9/2005 | Horibe et al. | |
| 2006/0057388 A1 * | 3/2006 | Jin et al. ........................ | 428/408 |
| 2006/0086958 A1 | 4/2006 | Eimori | |
| 2007/0205450 A1 | 9/2007 | Okita | |
| 2007/0231946 A1 * | 10/2007 | Orlowski et al. ............... | 438/99 |

FOREIGN PATENT DOCUMENTS

| WO | 2006010684 A | 2/2006 |
|---|---|---|
| WO | 2007022359 A | 2/2007 |

OTHER PUBLICATIONS

Hoenlein W., "New Prospects for Microelectronics: Carbon Nanotubes," Japanese Journal of Applied Physics, Tokyo, JP, vol. 41, No. 6B, part 01, Jun. 1, 2002, pp. 4370-4374.

* cited by examiner

*Primary Examiner* — Lan Vinh
(74) *Attorney, Agent, or Firm* — The NOblitt Group, PLLC

(57) ABSTRACT

A method for forming a nanotube/nanofiber growth catalyst on the sides of portions of a layer of a first material, comprising the steps of depositing a thin layer of a second material; opening this layer at given locations; depositing a very thin catalyst layer; depositing a layer of the first material over a thickness greater than that of the layer of the second material; eliminating by chem./mech. polishing the upper portion of the structure up to the high level of the layer of the second material; and eliminating the second material facing selected sides of the layer portions of the first material.

8 Claims, 4 Drawing Sheets

HORIZONTAL NANOTUBE/NANOFIBER GROWTH METHOD

BACKGROUND OF THE INVENTION

1. Field of the Invention

The present invention relates to the horizontal growth of nanotubes/nanofibers. "Horizontal growth" is used to designate a growth in directions substantially parallel to the plane of a substrate, this growth developing from one or several sides of pad or of a thin layer portion.

The present invention more specifically relates to a connection method usable to form connection planes in the upper layers of an integrated circuit.

2. Discussion of the Related Art

Nanotubes/nanofibers, for example carbon nanotubes or silicon nanofibers, have many applications. One of the currently most common methods for growing such nanotubes/nanofibers is to make them grow from the bottom of a cylindrical cavity. This growth mode is particularly suited to the forming of vertical connections between horizontal conductive regions of connection planes of an integrated circuit.

FIGS. 1A and 1B illustrate steps of the manufacturing of an integrated circuit connection level by a so-called "damascene" technique.

As illustrated in FIG. 1A, it is started from the upper surface of a layer 1 made of an insulating material, at some locations of which metal vias 2a, 2b, 2c, 2d make flush. An insulating layer 4 which is etched to form openings 5a, 5b, 5c is deposited on this structure.

At the step illustrated in FIG. 1B, the openings have been filled with a metal such as copper by first uniformly depositing a copper layer thicker than insulating layer 4, then performing a chem./mech. polishing (CMP) of this layer so that it fills openings 5 formed in layer 4. Copper regions 6a, 6b, 6c have thus been formed. In the shown example, copper layer portion 6a is intended to form a connection between via 2a and a higher-level via 8a distant in top view from via 2a. Layer portion 6b simply behaves as a connection pad between a lower via 2b and an upper via 8b. Layer portion 6c is intended to ensure the connection between vias 2c and 2d, and possibly with a higher-level via 8c.

As the integrated circuit dimensions decrease, the widths and the thicknesses of metal tracks such as tracks 6a and 6c of FIG. 1B tend to decrease. As a result, it becomes more and more difficult to run relatively high currents through such conductors without causing an excessive warming up, or even a diffusion of the metals into the adjacent layers or, again, a destruction of such conductors.

It has been provided to replace the conductors formed of metal layers with conductors formed of structures such as carbon nanotubes or other nanofibers. However, the practical implementation of such structures comes against many difficulties.

SUMMARY OF THE INVENTION

Thus, an embodiment of the present invention provides a method for manufacturing an integrated circuit connection layer structure comprising carbon nanotubes or nanofibers extending horizontally from a vertical wall.

Thus, an embodiment of the present invention provides a method for forming a catalyst of the growth of nanotubes/nanofibers on the sides of portions of a layer of a first material, comprising the steps of depositing a thin layer of a second material; opening this layer at given locations; depositing a very thin catalyst layer; depositing a layer of the first material over a thickness greater than that of the layer of the second material; eliminating by chem./mech. polishing the upper portion of the structure up to the high level of the layer of the second material; and eliminating the second material facing selected sides of the layer portions of the first material.

According to an embodiment of the present invention, the method further comprises, after elimination of the second material facing selected sides of the portions of the first material, a step of thermal processing to condition apparent regions of the catalytic material layer.

According to an embodiment of the present invention, the openings in the thin layer of a second material are flared upwards.

According to an embodiment of the present invention, the deposition of a very thin catalyst layer is performed obliquely.

An embodiment of the present invention provides a method for forming a connection level of an integrated circuit comprising the steps of depositing an insulating layer; opening this layer at the locations where a connection is desired to be established with a lower-level via and at the end locations of he rectilinear conductive tracks; depositing a nanotube/nanofiber growth catalyst layer; filling the openings with conductive pads; eliminating portions of the insulating layer in rectilinear regions extending between two opposite surfaces of conductive pads; and growing nanotubes/nanofibers.

According to an embodiment of the present invention, the nanotubes/nanofibers are carbon nanotubes and the catalyst is a material selected from the group of materials of the family of iron and of their oxides or compounds.

According to an embodiment of the present invention, the catalyst layer is submitted to a thermal coalescence processing immediately before the nanotube growth step.

According to an embodiment of the present invention, the conductive material is copper.

According to an embodiment of the present invention, the method further comprises, after the catalytic material deposition step, the step of depositing a layer having a barrier/bonding function.

The foregoing aspects of the present invention will be discussed in detail in the following non-limiting description of specific embodiments in connection with the accompanying drawings.

DETAILED DESCRIPTION

As usual in the representation of integrated circuits, the various drawings are not drawn to scale.

FIGS. 2A to 2E illustrate an example of application of a method according to an embodiment of the present invention.

Figure 1A:
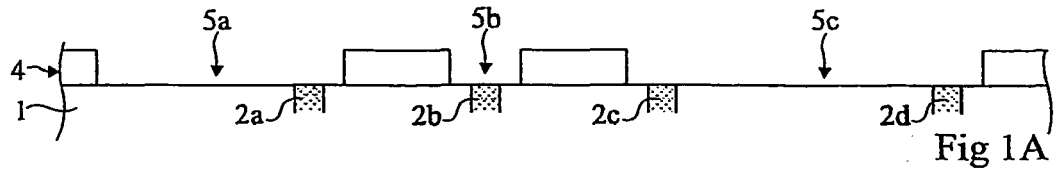
FIGS. 1A and 1B, previously described, illustrate a method for forming an integrated circuit connection layer, currently called a damascene layer.
Figure 1B:
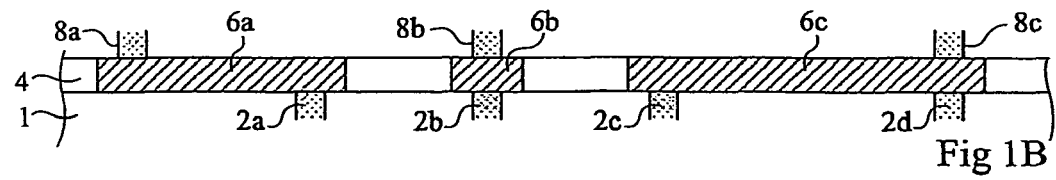

In this example, it is desired to form a connection level having the same functions as the connection level described in relation with FIGS. 1A and 1B. Thus, it is desired to form a first conductive track establishing the connection between a lower via 2a and an upper via 8a, a pad establishing a direct connection between a lower via 2b and an upper via 8b, and a connection connecting a lower via 2c, another lower via 2d, and possibly an upper via 8c.

Figure 2A:
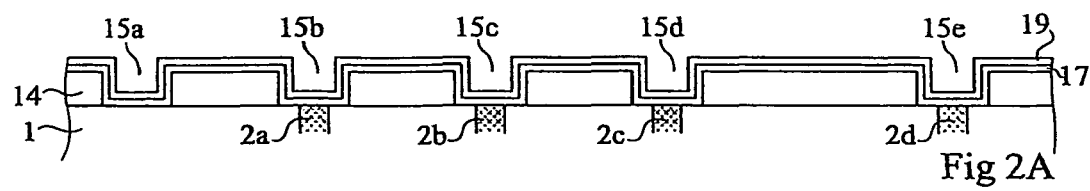
FIGS. 2A to 2E illustrate successive steps of a method for manufacturing an integrated circuit connection structure according to an embodiment of the present invention.

In FIG. 2A, as in FIG. 1A, an insulating layer 1 at the upper surface of which vias 2a, 2b, 2c, and 2d are formed has been shown. It is started by depositing an intermediary layer 14 on the structure. Intermediary layer 14 is an insulating layer in the case of the shown example, where portions of this layer must remain in place at the end of the manufacturing. Intermediary layer 14 may be made of any sacrificial material in the case (not shown) where all the elements of this layer will be eliminated at a subsequent step. Openings 15a to 15e are dug into layer 14 at the end locations of rectilinear tracks, which is the case for openings 15a-15b and 15d-15e, and at the locations where conductive pads are desired to be formed, which is the case for opening 15c.

On the structure comprising layer 14 provided with openings 15a to 15e, a layer 17 of a nanotube/nanofiber growth catalyst and possibly a barrier layer 19 for the diffusion of a subsequently-deposited conductive layer are deposited. It will be noted that, instead of being deposited as a continuous layer, the catalyst can have the form of particles or of a discontinuous layer. In the case where the conductive material to be deposited is copper, the material of layer 19 will for example be TiNx, TaNx, WC, WCN .... This barrier material layer is deposited by any adapted known method (for example, physical vapor deposition, chemical vapor deposition, or an electrochemical method).

Figure 2B:
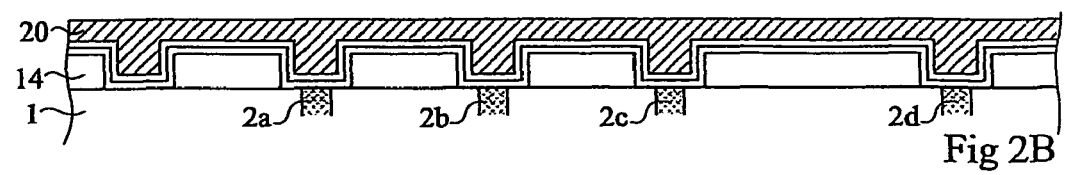

As illustrated in FIG. 2B, a uniform layer of a conductive material 20 is then deposited, for example, copper, but it may also be silver, tungsten, or a metal alloy or compound adapted to a chem./mech. polishing. Layer 20 is deposited across a thickness sufficient to fill openings 15a to 15e and to exhibit a substantially planar surface.

Figure 2C:
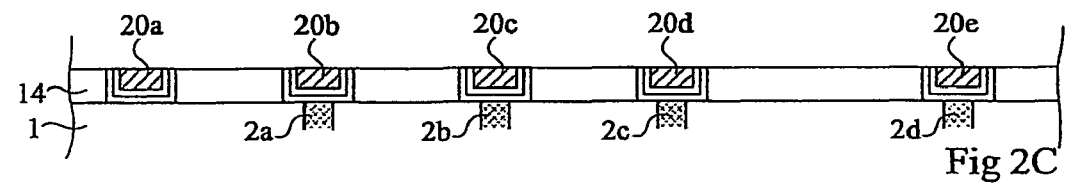

FIG. 2C shows the same structure after a step of chem./mech. polishing of copper 20. This chem./mech. polishing step is carried on until the upper horizontal portions of barrier layer 19 and of catalyst layer 17 are eliminated, so that copper pads 20a to 20e remain in place in openings 15a to 15e.

Figure 2D:
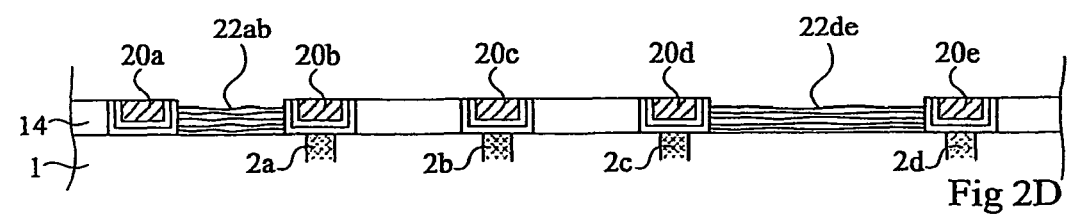

At the step illustrated in FIG. 2D, material 14 has been eliminated by masking and etching, or by any other appropriate means, at the locations where a rectilinear track is desired to be formed, that is, between opposite surfaces of pads 20a-20b and between opposite surfaces of pads 20d-20e. This etching, which of course is a selective etching of the material of layer 14 with respect to all the other materials in the structure, exposes the opposite surfaces of pads 20a-20b and 20d-20e coated with an apparent layer of the nanotube/nanofiber growth catalyst deposited at the step illustrated in FIG. 2A. After this, a growth of nanotubes/nanofibers which extend from each of the opposite surfaces towards the opposite surface is carried out by any known method. A connection between pads by nanofiber bundles 22a-b and 22d-e is thus obtained. As indicated previously, such nanotube/nanofiber bundles advantageously replace a track of a conductive material, including a copper track of small dimensions.

Figure 2E:
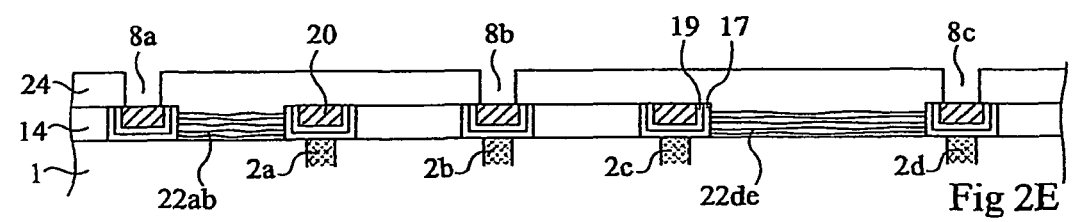

At the step illustrated in FIG. 2E, the entire structure has been coated with a new insulating material layer 24 provided with openings at the level of pads 20 above which vias 8a, 8b, 8c towards a higher connection level are desired to be formed.

It should be noted by those skilled in the art that the foregoing only describes a specific example of application of a method according to the present invention. In the context of this example, many variations are possible as concerns the used materials, which must only be mutually compatible, selectively etchable, and capable of standing the successively-used processing temperatures. On the other hand, it is also known by those skilled in the art that various very thin intermediary layers, neither described nor shown, may be used to ensure bonding, barrier, insulation, protection, etch stop, etc. functions. Also, each of the materials described as an example may be replaced with a material having the same functions in the considered method and in the structure to be obtained.

The present invention has been described in the context of the forming of a connection plane above an integrated circuit. Generally, the present invention applies to the forming of horizontal nanotubes/nanofibers, extending from sides of thin layers coated with nanotube/nanofiber growth catalysts. These bundles will not necessarily have a connection function but may have other functions, for example may form active or passive electronic components such as transistors or resistors. MOS or bipolar transistors may be formed from properly-doped silicon nanofibers. It may also be desired to form structures only or further having a mechanical function to form electromechanical microstructures (MEMS).

Among the benefits of the described method, it should be noted that the nanotube/nanofiber growth catalyst formed on the sides of layer portions or conductive pads may be of particularly good quality. Indeed, this vertical catalyst portion is submitted to no masking step to perform a selective (plasma) etch of other portions of this same catalyst layer. A masking and a partial plasma etch would inevitably result by the various known methods in somewhat altering and/or in contaminating the portions which are not etched. To expose the vertical catalyst portions, insulating/sacrificial material 14 facing these vertical portions is simply etched, as shown at the step of FIG. 2D. The insulating/sacrificial material may be selected so that its elimination in no way alters the quality of the catalyst layer.

Among known nanotube/nanofiber growth catalysts, materials from the iron family (iron, nickel, cobalt) and their oxides or other compounds should be noted for carbon nanotubes. Such materials are generally deposited by CVD or by sputtering and possibly submitted to a dewetting process (elevation to a temperature close to the melting point to cause a coalescence of the material). For the growth of silicon nanowires, materials such as gold, platinum, alloys of these materials, and possibly silicides of these materials, which are also deposited and possibly submitted to a dewetting process, may be used. The method described herein is adapted to separating the steps of deposition and of thermal processing of the catalyst materials. For example, the deposition may be performed at the step illustrated in FIG. 2A while the coalescence process may be implemented only at the step illustrated in FIG. 2D. This further improves the quality of the catalyst, which is a major point to enable a satisfactory growth of nanotubes/nanofibers of desired characteristics.

As an example of possible size ranges, it will be noted that the intermediary layer 14 can have a thickness comprised between about 5 nm and about 200 μm and, preferentially, in the application to the implementation of interconnections, a thickness comprises between 10 nm and 500 nm. Additionally, the catalyst layer 17 preferentially has a thickness twice smaller than the thickness of the intermediary layer 14.

The present invention is likely to have many other variations and modifications.

Figure 3A:
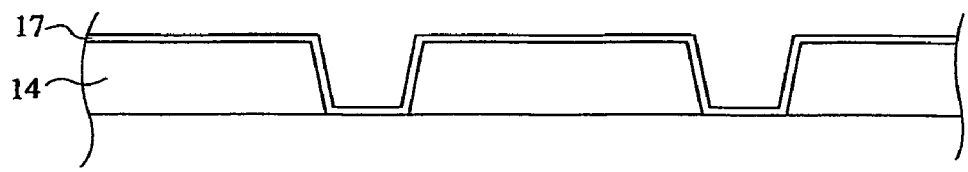
FIGS. 3A and 3B illustrate a variation of steps of implementation of a method according to the present invention.
Figure 3B:
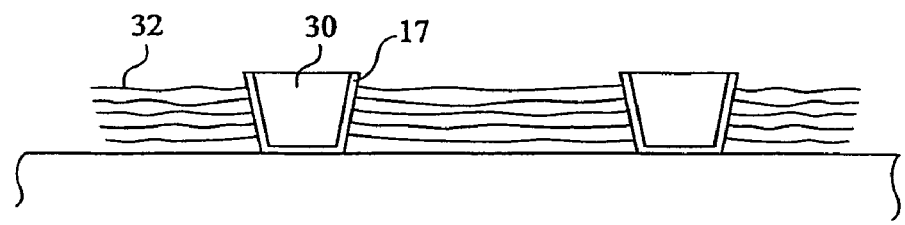

A first variation is illustrated in FIGS. 3A and 3B. During the etching of insulating/sacrificial material layer 14, an etch process which enables forming of openings with outward-flared sides, or with a positive inclination, may be selected as shown in FIG. 3A. FIG. 3B illustrates the result obtained after having carried out the step sequence corresponding to FIG. 2D. Conductive pads having vertical walls with a negative inclination are thus obtained. Then, nanotubes/nanofibers 32 which develop from catalyst layer 17 appearing on these vertical walls tend to rather start downwards, which favors a start towards the opposite side.

Figure 4A:
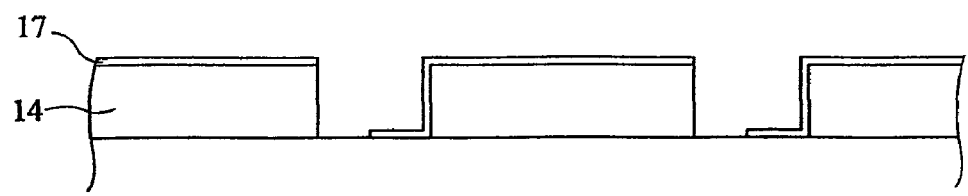
FIGS. 4A and 4B illustrate another variation of steps of implementation of a method according to the present invention.
Figure 4B:
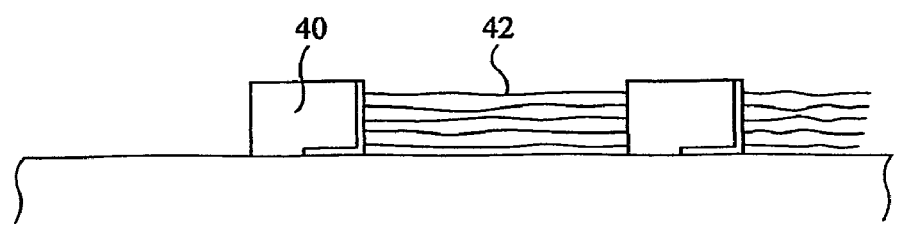

Another variation of the present invention is illustrated in FIGS. 4A to 4B. In FIG. 4A, insulating/sacrificial material layer 14 provided with openings has been shown. The deposition of catalyst layer 17 is performed by an oblique deposition method, so that this layer forms on one side only of the openings formed in this layer 14 and not on the opposite side. Then, at the step illustrated in FIG. 4B (which corresponds to FIG. 2D), nanotubes/nanofibers 42 will only develop from one surface of a pad 40 towards an opposite unprocessed surface of another pad.

Figure 5:
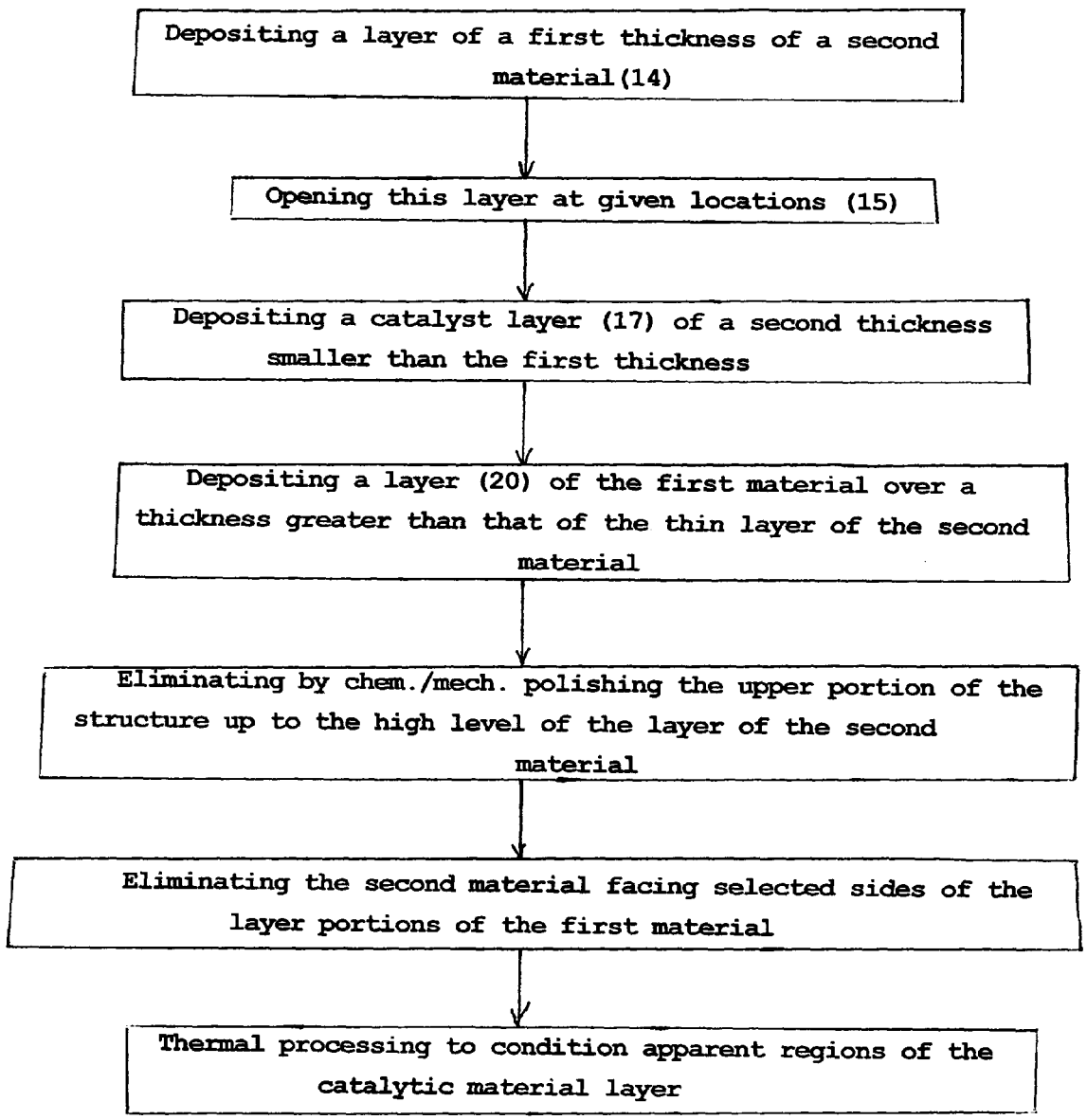
FIG. 5 illustrates an embodiment of the invention in Flow Chart format.

With continued reference to FIGS. 1-4, refer now to FIG. 5, wherein reference numerals corresponding to those in other Figures have been utilized. FIG. 5 illustrates an embodiment of the invention in flow chart format, as follows.

A method for forming a nanotube/nanofiber growth catalyst on the sides of portions of a layer of a first material, comprising the steps of:
  depositing a layer of a first thickness of a second material (14);
  opening this layer at given locations (15);
  depositing a catalyst layer (17) of a second thickness smaller than the first thickness;
  depositing a layer (20) of the first material over a thickness greater than that of the thin layer of the second material;
  eliminating by chem./mech. polishing the upper portion of the structure up to the high level of the layer of the second material;
  eliminating the second material facing selected sides of the layer portions of the first material; and
  after elimination of the second material facing selected sides of the portions of the first material, a step of thermal processing to condition apparent regions of the catalytic material layer.

Figure 6:
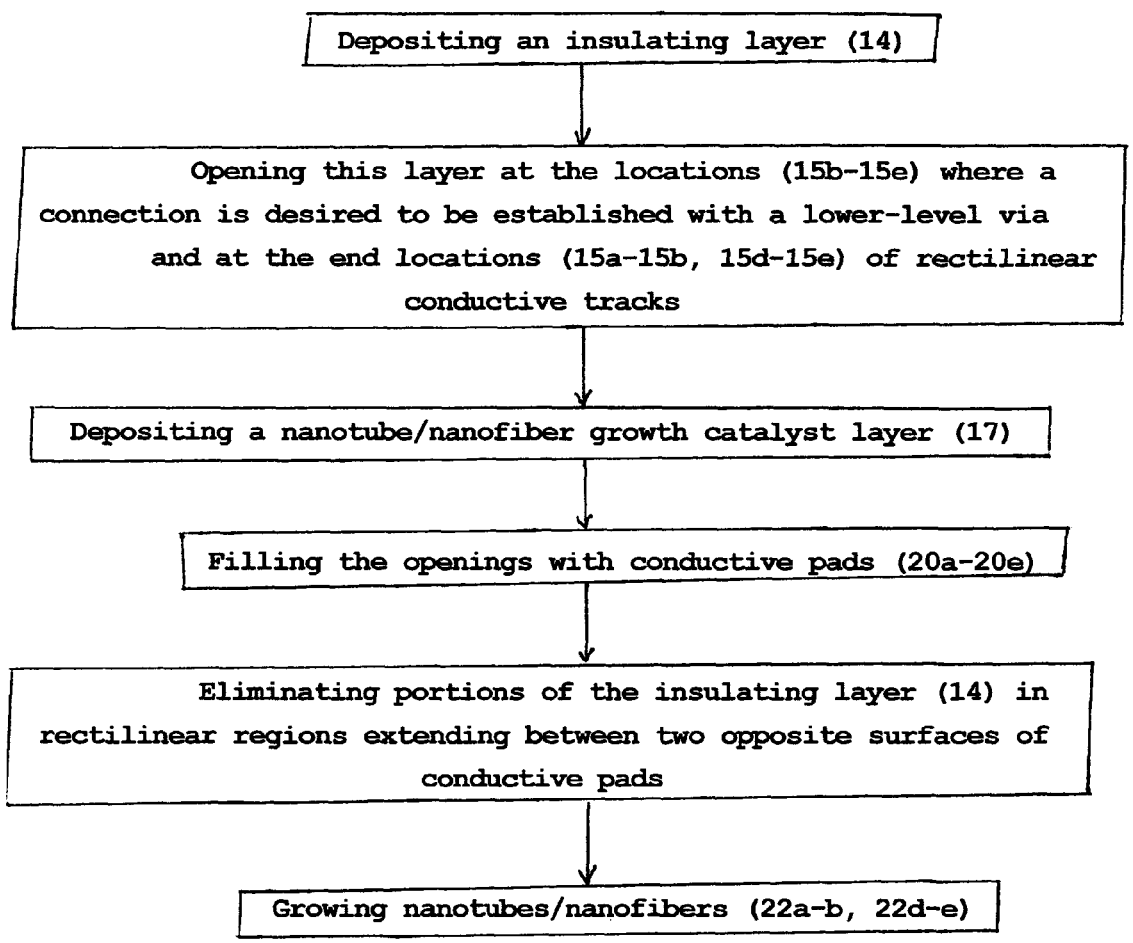
FIG. 6 illustrates an embodiment of the invention in Flow Chart format.

With continued reference to FIGS. 1-4, refer now to FIG. 6, wherein reference numerals corresponding to those in other Figures have been utilized. FIG. 6 illustrates an embodiment of the invention in flow chart format, as follows.

A method for forming a connection level of an integrated circuit comprising the steps of:
  depositing an insulating layer (14);
  opening this layer at the locations (15b-15e) where a connection is desired to be established with a lower-level via and at the end locations (15a-15b, 15d-15e) of rectilinear conductive tracks;
  depositing a nanotube/nanofiber growth catalyst layer (17);
  filling the openings with conductive pads (20a-20e);
  eliminating portions of the insulating layer (14) in rectilinear regions extending between two opposite surfaces of conductive pads; and
  growing nanotubes/nanofibers (22a-b, 22d-e).

It should also be noted by those skilled in the art that as concerns the method for manufacturing integrated circuit connection structures, only the forming of horizontal connections formed by nanotubes/nanofibers has been mentioned. Vertical connections or vias may also be formed by nanotube/nanofiber bundles.

As an example only, it should be noted that conductive layers 20, 30, 40 may have thicknesses ranging between 50 nm and a few hundreds of nm and that the nanotube/nanofiber bundles may have lengths ranging up to a few hundreds of μm.

In another alternative of the disclosed embodiment, during the growth step of FIG. 2D, it is possible to grow nanowires of materials known for their capability of transiting from an amorphous phase to a crystalline phase, then from a crystalline phase to an amorphous phase under the effect of a current, for example $Ge_2Te_2Sb_5$, $GeTe$, $SbTe$ . . . , as disclosed by S. Meister et al., "Synthesis and characterization of phase-change nanowires," Nano Letters 6 (7), 1514-1517 (2006).—Se-Ho Lee, Yeonwoong Jung, and Ritesh Agarwal, "Highly scalable non-volatile and ultra-low-power phase-change nanowire memory," Nat Nano 2 (10), 626-630 (2007).

The bi-dimensional structure obtained can be encapsulated partially or fully so as to keep the mechanical integrity of the device (refer to FIG. 2E) and for limiting the evaporation of the phase-change material during cycles of writing-erasing. CVD insulating layer can be used ($SiO_2$, $HfO_2$, $ZRO_2$, $SiN$). In operation, as usual in the phase-change memories, voltage pulses switch the device from the crystalline state (low resistance) to the amorphous state (high resistance) (writing step) then from the amorphous phase to the crystalline phase (erasing step). The information is read on the device by measuring the resistance with a low voltage.

This structure has in particular the following benefits:
  On the phase-change memories, a scale reduction provides, inter alia, a reduction of the writing voltages (Se-Ho Lee, Yeonwoong Jung, and Ritesh Agarwal, "Highly scalable non-volatile and ultra-low-power phase-change nanowire memory," Nat Nano 2 (10), 626-630 (2007)).
  The use of nanowires rather than etching steps limits the modification of the material by etching.
  With respect to the known devices (Se-Ho Lee, Yeonwoong Jung, and Ritesh Agarwal, "Highly scalable non-volatile and ultra-low-power phase-change nanowire memory," Nat Nano 2 (10), 626-630 (2007)), the above-disclosed device does not necessitate the removal and re-insertion of nanowires. The nanowires are automatically connected to the electrodes.

Specific embodiments of the present invention have been described. Different variations and modifications will occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for forming a nanotube/nanofiber growth catalyst on the sides of portions of a layer of a first material, comprising the steps of:
  depositing a layer of a first thickness of a second material;
  forming flared openings at given locations of the layer;
  depositing a catalyst layer of a second thickness smaller than the first thickness;
  depositing a layer of the first material over a thickness greater than that of the thin layer of the second material;
  eliminating by chem./mech. polishing the upper portion of the structure up to the high level of the layer of the second material; and
  eliminating the second material facing selected sides of the layer portions of the first material.

2. The method of claim 1, thither comprising: thermal processing.

3. The method of claim 1, wherein the deposition of the catalyst layer is performed obliquely.

4. A method for forming a connection level of an integrated circuit comprising the steps of:
- depositing an insulating layer;
- forming flared openings in the layer at the locations where a connection is desired to be established with a lower-level via and at end locations of rectilinear conductive tracks;
- depositing a nanotube/nanofiber growth catalyst layer;
- filling the openings with conductive pads;
- eliminating portions of the insulating layer in rectilinear regions extending between two opposite surfaces of conductive pads; and
- growing nanotubes/nanofibers.

5. The method of claim 4, wherein the conductive material pads are copper.

6. The method of claim 4, further comprising, after the catalytic material deposition step, the step of depositing a barrier layer.

7. The method of claim 4, wherein the nanotubes/nanofibers are carbon nanotubes and the catalyst is a material selected from the group of materials of the family of iron and of their oxides or compounds.

8. The method of claim 7, wherein the catalyst layer is submitted to a thermal coalescence processing immediately before the nanotube growth step.

* * * * *